(12) United States Patent  
Colvin

(10) Patent No.: US 8,797,052 B2  
(45) Date of Patent: Aug. 5, 2014

(54) SYSTEM AND METHOD FOR GRADIENT THERMAL ANALYSIS BY INDUCED STIMULUS

(76) Inventor: James B. Colvin, Newark, CA (US)

( * ) Notice: Subject to any disclaimer, the term of this patent is extended or adjusted under 35 U.S.C. 154(b) by 707 days.

(21) Appl. No.: 12/945,284

(22) Filed: Nov. 12, 2010

(65) Prior Publication Data

US 2011/0115510 A1    May 19, 2011

Related U.S. Application Data

(60) Provisional application No. 61/281,154, filed on Nov. 14, 2009.

(51) Int. Cl.
*G01R 31/00* (2006.01)

(52) U.S. Cl.
USPC .................. 324/750.03; 324/750.01

(58) Field of Classification Search
None
See application file for complete search history.

(56) References Cited

U.S. PATENT DOCUMENTS

| | | | |
|---|---|---|---|
| 6,078,183 A * | 6/2000 | Cole, Jr. | 324/754.23 |
| 7,323,888 B1 * | 1/2008 | Colvin | 324/750.19 |
| 7,971,176 B2 * | 6/2011 | Desineni et al. | 716/136 |
| 2008/0088324 A1 * | 4/2008 | Desplats et al. | 324/753 |

* cited by examiner

*Primary Examiner* — Vinh Nguyen

(74) *Attorney, Agent, or Firm* — The Danamraj Law Group, P.C.

(57) ABSTRACT

A thermal gradient is induced in a device-under-test (DUT) and used to determine the location of a defect. In one embodiment, a laser creates a moving thermal gradient from a test site on the DUT and a respective time of flight for the thermal gradient to trigger a condition associated with the defect is determined. Repeating the time of flight testing at additional test site provides information used to trilaterate the defect in three dimensions. Alternately, a static thermal gradient is induced across at least a portion of the DUT along a first axis. The thermal gradient is incrementally walked along the first axis until the condition associated with the defect is triggered, thereby defining a first region. The thermal gradient is then induced along a second axis of the DUT and the process is repeated to define a second region. The location of the defect is determined to be the intersection of the first region with the second region.

21 Claims, 6 Drawing Sheets

SYSTEM AND METHOD FOR GRADIENT THERMAL ANALYSIS BY INDUCED STIMULUS

PRIORITY UNDER 35 U.S.C. §119(e) & 37 C.F.R. §1.78

This nonprovisional application claims priority based upon the following prior U.S. provisional patent application entitled: "TIME OF FLIGHT LOCALIZATION OF DEFECTS USING INDUCED THERMAL WAVE PROPAGATION TECHNIQUES," Application No. 61/281,154, filed Nov. 14, 2009, in the name(s) of James Barry Colvin; which is hereby incorporated by reference in its entirety for all purposes.

BACKGROUND OF THE DISCLOSURE

1. Technical Field

The present disclosure generally relates to techniques in failure analysis of electronic devices such as semiconductor integrated circuits, packages, boards, and the like. More particularly, and not by way of any limitation, the present disclosure is directed to a system and method for isolating failures in electronic devices using gradient thermal analysis by induced stimulus.

2. Description of Related Art

In the field of failure analysis of integrated circuits, diagnosing functional failures is a requirement. Traditional beam-based analysis techniques use a scanning laser or electron beam to induce a parametric shift, which is monitored through changes in current or voltage driven to the device. Deep sub-micron technologies frustrate these analytical methods due to the nearly immeasurable parametric shifts externally caused by a small signal leakage path internally. These internal failures can be identified functionally by their dependence on timing, temperature or voltage, but the exact location of the fault is difficult to isolate. A number of testing methods, e.g., Stimulus Induced Fault Test (SIFT), Resistive Interconnect Localization (RIL) and Soft Defect Localization (SDL), can identify anomalies functionally using induced thermal gradients to the metal but do not address how to analyze embedded temperature sensitive defects that are inaccessible to the laser. Stacked die and similar three-dimensional devices complicate the analysis, as these require the destruction or removal of one or more die.

BRIEF DESCRIPTION OF THE DRAWINGS

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Figure 1A:
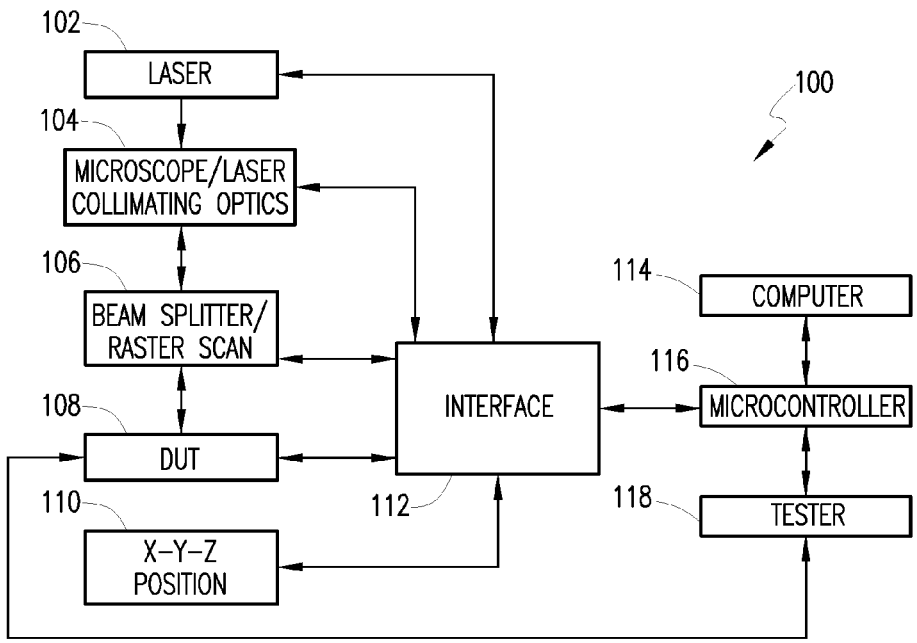
FIG. 1A depicts a block diagram of an apparatus operable for gradient thermal analysis in accordance with an embodiment of the present disclosure.

In general, the present disclosure involves applying energy, e.g., heat, to a semiconductor die, electronic device, parts, etc. to create a thermal gradient over at least a portion of the device. As the thermal gradient is propagated across the device, various measurements are correlated with a known condition, such as failure of the device or a shift in the functional output from the device, to determine the location of the defect. Although the disclosed embodiments describe the applied energy in terms of a laser used to create a thermal gradient across the device-under-test, the applied energy can take other forms, e.g., any electromagnetic, electrostatic and magnetic fields, acoustic or RF signals, optical or electron beams that can stimulate the DUT to a reproducible response at a known value of stimulation and that can be applied to the DUT in a manner that creates a precise, controllable gradient across the DUT.

In one aspect, the present disclosure is directed to a method that comprises the following operations: selecting a plurality of test sites on a device-under-test (DUT); for each of the plurality of test sites, heating the test site at a controlled rate and capturing a corresponding time frame until the heating triggers a known condition; and determining a region causing the known condition using coordinates of the plurality of test sites and the corresponding time frames.

In another aspect, the present disclosure is directed to an apparatus, comprising: a laser for controllably heating a test site on a device-under-test (DUT); a sensor for capturing a response signal from the DUT; a linear positioning device operable to position the DUT for selection of test sites; and a controller operably coupled to the laser, the sensor and the linear positioning device to provide overall control thereof, wherein the controller is operable to determine a time frame between initiating heating of a test site and receiving a known response signal.

In a further embodiment, the present disclosure is directed to a method, comprising: creating a quantifiable, precise thermal gradient across a device-under-test (DUT), the thermal gradient being aligned along a first axis of the DUT and encompassing a pre-determined temperature known to trigger a given condition; incrementally moving the thermal gradient along the first axis until the given condition is triggered; identifying a first region of the DUT that is currently at the pre-determined temperature; creating the quantifiable, precise thermal gradient across the DUT and aligned along a second axis of the DUT; incrementally moving the thermal gradient along the second axis until the given condition is triggered; identifying a second region of the DUT that is currently at the pre-determined temperature; and determining the region triggering the given condition to be an intersection of the first region and the second region.

In a further aspect, the present disclosure is directed to an apparatus, comprising: means for creating a quantifiable, precise thermal gradient on a device-under-test (DUT); a controller operable to walk the thermal gradient across the DUT; a sensor connected to receive an output from the DUT; and means for correlating information from the means for creating, the controller and the sensor to determine a region causing a known condition.

In a further aspect, the present disclosure is directed to a method, comprising: selecting a plurality of test sites on a device-under-test (DUT); for each of the plurality of test sites, exciting the test site at a controlled rate and capturing a corresponding elapsed time until the excitation triggers a known condition; and determining a region causing the known condition using coordinates of the plurality of test sites and the corresponding elapsed times.

Embodiments of the disclosure will now be described with reference to various examples of how the disclosure can be made and used. Like reference numerals are used throughout the description and several views of the drawings to indicate like or corresponding parts, wherein the various elements are not necessarily drawn to scale.

Several techniques that contribute to the disclosed fault testing methods and apparatus are briefly discussed for greater understanding. One such technique is the Stimulus Induced Fault Test (SIFT) system, which is discussed in greater detail in U.S. Pat. No. 7,323,888, which has a common inventorship with the present disclosure and which is hereby incorporated by reference. SIFT uses a scanning/imaging system having a fixed stimulus source with a controllable spot size for applying the stimulus to a DUT. A sensor is operable for capturing a functional response signal from the DUT, while a linear positioning device facilitates application of the stimulus to successive portions of the DUT. The stimulus source can be a variety of electromagnetic, electrostatic, magnetic, acoustic or radio frequency (RF) signals, optical or electron beams, etc. that are capable of exciting a portion of the DUT covered by the variable spot size. The functional output of the DUT can be monitored during excitation to detect faults in the DUT.

Because the SIFT scanner does not use traditional laser scanning microscope optics, the DUT scan area can be sub-micron to 12" or more, allowing whole boards, packages and die to be analyzed. Field of view limitations of objectives on Laser Scan Microscope based equipment are eliminated with SIFT. Data output is to a PC via the microcontroller and contains data from the scan for x, y, z and multi-channel data for each step in the scan. Channel data can contain pass/fail signals from the tester as well as analog information. The scan and step is user defined based on spot size.

Several methods of performing differential thermal laser stimulus can be used to isolate regions of interest on a DUT. Testing a device using these methods can show, for example, unexpected variations in current or voltage, although the data may not clearly show which areas stimulated by the laser improve or degrade the differences. The laser can be steered to and parked on regions of interest while maintaining constant power and focus. In this manner, nodes responsible for the shift can be isolated, although false positives can be created when a focused laser is used to scan across the die. At least some embodiments of the disclosed methods, e.g., differential SIFT as discussed with reference to FIGS. 3 and 4, avoid this issue since the temperature differential is not severely localized.

In order to determine appropriate power levels for frontside and backside analysis, it is necessary to understand the parametric issues surrounding thermal management. A simple way to determine the required energy is to look at a diode to substrate on the device-under-test. Generically, the substrate diode associated with a given input pin is a known temperature sensor. While the forward voltage in the substrate diode may vary process to process, the $\Delta V$ can still be used to measure temperature excursions, as the relationship between current and voltage can be shown to constant at a given temperature.

The thermal propagation in silicon should also be considered for frontside and backside analysis. In testing, the excursion in temperature for frontside stimulation was found to be generally fairly small, on the order of 5 to 10 degrees C. Since the substrate is tied to a copper paddle, the general die heating is reliant on the paddle, which is floating. The temperature gradient is low due to the thermal conduction of the die and paddle. For the backside, a die was thinned to 30 µm remaining silicon thickness in order to evaluate lateral heat spread with very thin substrates. This resulted in a rapid ramping of temperature and a gradient now better than 100 degrees C. Since the silicon is thin and has greatly reduced volume there is much less lateral heat spread and a high differential thermal gradient.

Normally for thermal stimulus with a laser, wavelengths outside the indirect bandgap of silicon are required, e.g., 1.3 µm, to avoid generation of photocurrents. It is difficult to get the power necessary in a large spot to heat significantly at this wavelength due to numerous factors, such as laser power limitations. The silicon doesn't heat at this wavelength; instead, the primary heating is accomplished from absorption of the laser energy by the metal, which typically scatters a significant amount of the radiation. The temperature gradient at metal is roughly 1 degree C./mW with typical heating of the metal up to around 30 degrees C. with a 1.3 µm laser. Temperature excursion of the related silicon will be typically less than 1 degree C., inadequate for silicon based thermal analyses.

Ordinarily, shorter wavelength lasers generate too much photocurrent to be useful thermally. Several laser wavelengths of importance, due to their ability to generate higher power, are: 532 nm, 808 nm, 940 nm, and 1064 nm. All of these wavelengths will generate photocurrents unless they are masked from the die. This is accomplished by applying high temperature flat black paint to the die surface by spray, brush or spin deposition. The 532 nm laser does not typically need to be masked when used backside due to the absorption of the laser by the silicon substrate. Carbon sputtering or carbon paint can also be used backside or frontside if the connections are passivated. A 5 watt 808 nm laser was chosen to locally heat the surface with around 1 to 2 watts depending on spot size and desired heating for the above work. In the disclosed embodiments, a $CO_2$ laser is used.

In the present application, the use of gradient thermal analysis can aid in locating a defect without having to walk the thermal stimulus across a significant portion of the device. Prior to using gradient thermal analysis, the defect is characterized as to the temperature or range of temperatures that trigger the erroneous response in order to understand the thermal gradient range and hence laser power and hysteresis settings. Although we refer to the use of gradient thermal analysis throughout with reference to a defect, it will be understood that these techniques can also be used to locate any anomaly that provides a specific change, e.g., in temperature, in an output as long as the response is known and repeatable. Several embodiments of gradient thermal analysis by induced stimulus are disclosed. Each of the embodiments can be used to locate a defect in an integrated circuit, but the differing methods allow application to devices of different types. In the embodiments disclosed in FIGS. 3-6, a precise thermal gradient is created across at least a portion of the device. As the thermal gradient is "walked" across the portion of the device, output from the device can indicate the location of the defect. These embodiments require a controllable heat sink and source in order to create the thermal gradient. In applications in which it is difficult to contact the edges of the device, e.g., stacked die of differing dimensions, a stimulus source such as a laser heats a location on the device, creating a thermal wave of increasing temperature that propagates across the device-under-test (DUT) until the defect is stimulated to failure. By inducing the thermal wave from different locations on the die, the defect can be trilaterated, i.e., located in three dimensions. This embodiment is disclosed with regard to FIGS. 1 and 2.

Figure 2:
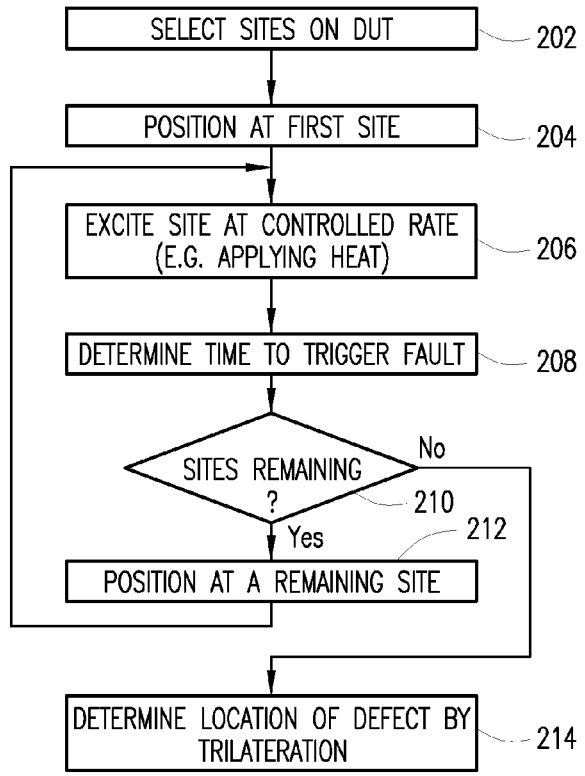
FIG. 2 is a flow chart of a method for gradient thermal analysis for use with the apparatus shown in FIG. 1 in accordance with an embodiment of the present disclosure.

Referring now to FIGS. 1 and 2, an embodiment of the disclosure that uses a Time of Flight Stimulus Induced Failure Test (TOFSIFT) is discussed. In general terms, TOFSIFT uses a thermal laser to heat a controllable spot size at a test site of known coordinates on a device-under-test while tracking a time frame between initializing the thermal stimulation and triggering of the known fault, i.e., the elapsed time. A number of test sites on the device are selected and a source of heat is applied to the DUT at each of the test sites in turn to create a thermal wave that propagates through the device in a controlled manner. The distance from the point of application to the defect is proportional to the time frame necessary for the triggering temperature to reach the defect; once the distance from a number of test sites are determined, the location of the defect can be determined by trilateration. Trilateration is a term most commonly used in surveying and navigation, including global positioning systems (GPS), and is the determination of a location using measurements of distance from a number of other points in the system using the geometry of spheres and triangles. Where possible, the time frame necessary for the thermal stimulus to propagate through the device-under-test from a test site to the defect is divided by the speed of propagation through the device to determine the distance from the defect. In cases where measuring the speed at which the thermal stimulus moves through the silicon is impractical, the ratio of the measured time frames from known test sites to the defect is scaled to best fit the locus. Thus, the actual propagation time of the signal does not need to be known. In addition to the factors discussed so far, other factors can influence the measurements, such as die attach materials, and must be adjusted for. Further, although the disclosed embodiments emphasize defect localization in integrated circuits, any quantifiable location can be localized. In the case of stacked die integrated circuits, the laser can be injected on the edges and/or surface of the package or dies in order to identify the location of an embedded defect. Multiple defects are more complex but can be discriminated by identifying the shortest mean path from multiple injection points radially.

With reference now to FIG. 1, an apparatus 100 for performing TOFSIFT comprises laser 102, microscope/collimating optics system 104, beam splitter/raster scan system 106, stage 110, interface 112, computer 114, micro-controller 116, and optionally tester 118. The device-under-test (DUT) 108 is also shown. Laser 102 is used to produce heat on DUT 108 and must be capable of power modulation in order to produce a traveling thermal wave. The laser power is controllable for both the on power and the off power states, with the off power typically being 0. The wavelength may be any appropriate wavelength suitable for producing heat local to the surface of DUT 108. Collimating optics 104 facilitates focus of the laser beam and also provides a means to raster the laser over the sample using deflection mirrors, if desired. For tests of this system as discussed below, a 10 µm $CO_2$ laser was chosen in order to heat a controlled spot with a diameter down to 100 µm. The diameter of the spot is less important than the damage threshold. The spot needs to be large enough to heat the die without local damage, since if the laser modifies the surface, the black body radiation absorption will change, affecting the measurements. In alternate embodiments, the laser can be replaced by other means of exciting the DUT, e.g., magnetic induction, RF signals, optical or electron beams. The use of magnetic induction for thermal stimulation of a DUT is disclosed in U.S. Pat. No. 6,608,291, which shares an inventor with the present application and which is hereby incorporated by reference.

Beam splitter 106 allows imaging and measurement of incident and reflected laser power. A means to raster the laser over the sample using deflection mirrors can be used for laser scan imaging to facilitate navigational placement of the beam. In at least one embodiment, stage 110 is used for placement of the laser when collecting TOFSIFT data, but either method of positioning the laser accomplishes the same end goal. Accurate placement of the spot is key since the trilateration is determined proportionately by the ratio of the radii. Device-under-test (DUT) 108 can be an integrated circuit (IC), IC package, board or any other product for which measurement of time delay by thermal waves can trilaterate a defect or region of interest. The material must be conductive to a propagating thermal wave and able to tolerate the incident laser energy nondestructively.

Stage 110 provides positioning of DUT 108 in x, y and z dimensions in order to know precisely where the incident laser energy is injected into the DUT. The requirement to rotate the sample allowing full access may be done manually or with the manipulation stage as controlled by micro-controller 116 and interface 112.

Interface 112 comprises a programmable fast AC/DC converter or comparator that is programmed to detect the threshold from the part, either as pass/fail data or analog change, and to measure the propagation delay time from the laser pulse to the defect or anomaly being monitored on DUT 108. Interface 112 also provides the ability to control the hysteresis of the on-to-off threshold point at which the laser is fired. Threshold detect limits and hysteresis are used to control laser oscillation and validate repeatability of the measured data. The laser is turned on when below threshold and off when above threshold. The time-on and time-off values are recorded and trilaterated with other unique data points in 3-D space. The local heating of the DUT is controlled by the dwell time of the laser required to trip from pass to fail. The hysteresis of the trip point to turn the laser on and off is determined experimentally. If the trip points are too close together, the laser can fire prematurely. Ideally, the on to off states should be chosen at around a 50% duty cycle upon setup at the first laser injection site. The cooling of the die and heating by laser normalize out die temperature issues and allow the die to act as a thermally stimulated oscillator. The frequency of the oscillator changes in proportion to the distance from the injection point to the defect or bond pad diode monitor. Averaging for a matrix of locations results in improved trilateration.

Computer 114 provides a user interface to collect and control data and hardware from the microcontroller. Microcontroller 116 provides timing critical measurements to computer 114 and controls all described aspects of elements 102-112. The microcontroller can be any microprocessor or Field Programmable Gate Array (FPGA) controller suitable to the required task. Tester 118 is optional and is used when the signal from the device is obtained from the tester rather than using the microcontroller. The tester interfaces directly with the device, providing Pass/Fail data to the microcontroller at speeds sufficient to allow accurate measurement of the thermal propagation time of flight.

Figure 1B:
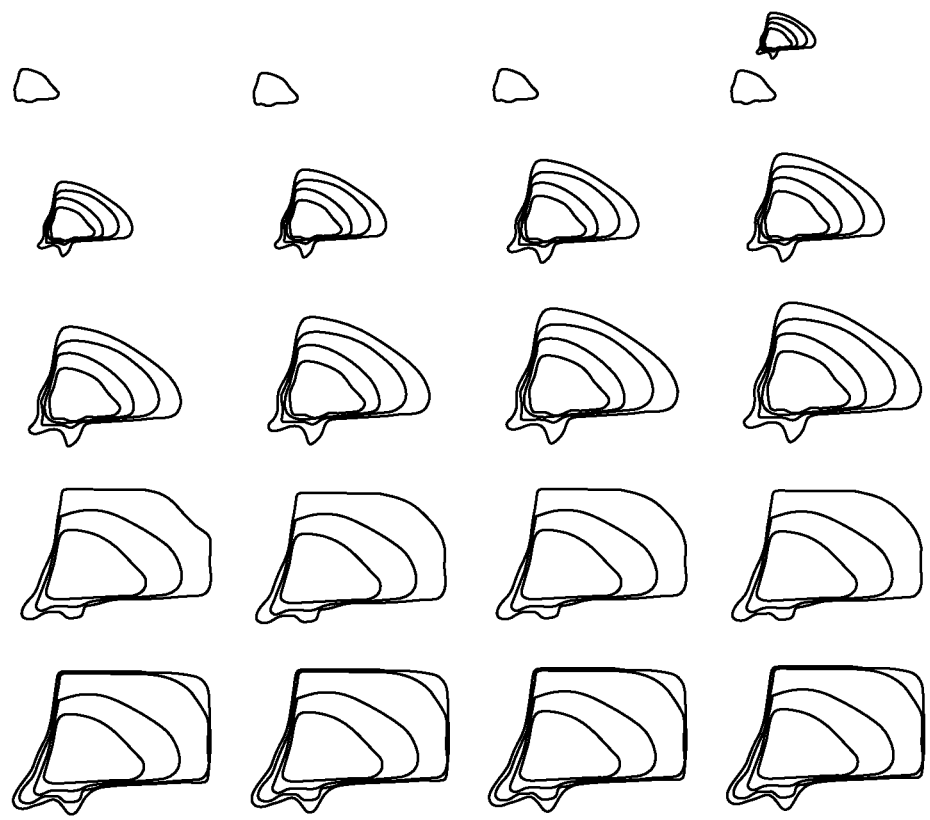
FIG. 1B illustrates the progression of a thermal wave created using a laser on a device-under-test.

FIG. 1B is a montage illustrating a thermal wave propagating for one on cycle from the lower left corner of the DUT, with each of the expanding lines representing a given temperature gradient. Each frame is 1/30 second, taken with an infrared, InSb camera. Note that the wave front gradient, i.e., the slope of change, reduces as it propagates. Although the thermal wave can only be visualized on the surface of the device, i.e., in the x-y plane, the thermal wave also propagates through the z dimension.

FIG. 2 is a flow chart of an example method for gradient thermal analysis using time of flight data as discussed with regard to FIG. 1. The method begins with the selection of test sites on the device-under-test (element 202). These sites can be on the frontside of the device or the backside of the device; the sites can also be on the edges of the device, if these are accessible. In at least one embodiment, the test sites are placed on a frontside or backside of the DUT, near but not at the edges of the device. The laser is positioned at a first of the selected sites (element 204). The site is excited at a controlled rate (element 206) and the time necessary to trigger the fault condition is determined (element 208). In one embodiment, the excitation is provided by a laser thermally exciting or heating the DUT, although other sources of excitation can be used, as noted earlier. If it is determined that other sites remain to be tested (element 210), the laser is positioned at a remaining site (element 212) after allowing the device to recover from previous testing and elements 206, 208 are repeated at the new site. Once no further sites are to be tested, the location of the defect is determined by trilateration (element 214).

Figure 1C:
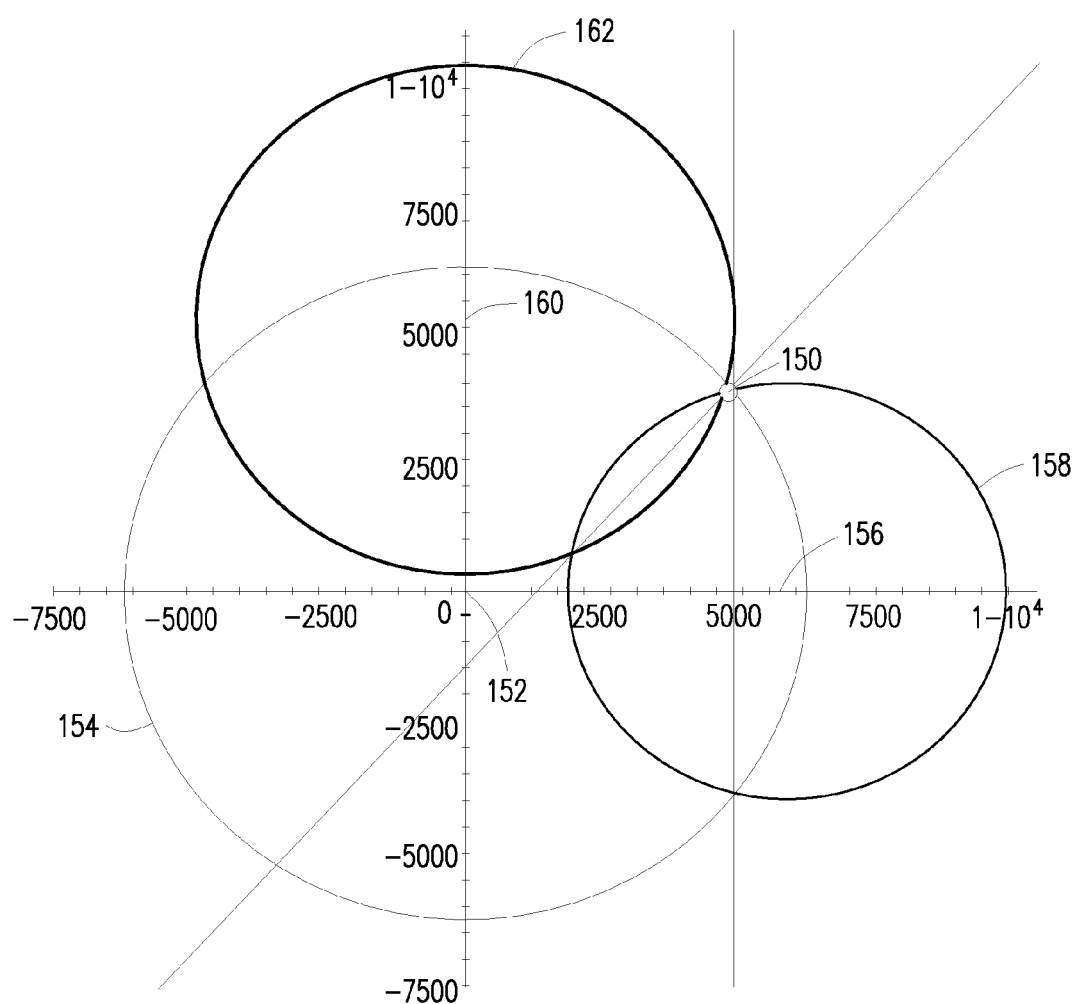
FIG. 1C illustrates triangulation of a defect, which is a simplification of the trilateration techniques discussed herein, using time of flight data from a device-under-test.

A simplified version of trilateration, which can determine a location in three dimensions, is triangulation, which can determine location in two dimensions. FIG. 1C illustrates a method of triangulation to determine the location of a site 150 by measuring the distance of site 150 from other sites in the system. In the system depicted, the three additional sites are site 152, located at (x, y) coordinates (0, 0), site 156, located at (5880, 0) and site 160, located at (0, 5260). The measured distance from site 150 to each of sites 152, 156, 160 defines a circle having a center at one of the sites and a radius equal to the measured distance. Thus, the distance between sites 150 and 152 defines the radius of circle 154; the distance between sites 150 and 156 defines the radius of circle 158 and the distance between sites 150 and 160 defines the radius of circle 162. Having thus defined the three circles, one can determine the location of site 150 using mathematics to determine the intersection of the three circles 154, 158, 162. One can see by examining this figure that any two of the circles intersect at two separate points, while the intersection of all three circles defines a single point. Trilateration is the extension of this idea into three dimensions by adding a third axis, the z-axis, that is perpendicular to the x-y plane shown. In the same way that three non-concentric circles can intersect at only one point, four non-concentric spheres can intersect at, and therefore define, a single point in three dimensions. It will be understood that while this application refers to a point of intersection of the spheres, due to the limits of precision in such measurements, trilateration of the data will often define a region rather than a point, although a smaller region than possible without these techniques. The selection of additional sites can be used to further refine the region.

When applying trilateration to the present task of locating a defect within a device-under-test, the time frame necessary for the thermal wave to travel from the test site to the defect is proportional to the distance from the defect. Where it is possible to determine the propagation rate of the thermal wave through the device, the radius of the sphere can be calculated by dividing the time frame by the propagation rate; otherwise, the locus or intercept of the corresponding radii can be scaled proportionately to match the physical distance even if the speed of the traveling thermal wave is unknown. A determination is then made of the intersection of the spheres; this intersection defines the location of the defect. The following test results were determined using this method.

The sample used in the test was a thin quad flat pack (TQFP) package, 14 mm×14 mm with an exposed copper paddle from the backside milled using the ASAP-1® DECAP machine. The die is 500 μm thick and the Cu paddle is 250 μm thick. The total z distance to the die face is 750 μm. Carbon paint was applied to normalize the laser absorption. In this test, an input diode represents the defect. A 10 μm laser was chosen to heat a controlled spot with a diameter down to 100 μm and programmed for four corners of the paddle and the center in micrometers, the results follow:

Site A: location=(5880,0,0), time frame=680 msec;
Site B: location=(0,0,0), time frame=976 msec;
Site C: location=(0,5260,0), time frame=832 msec;
Site D: location=(5880,5260,0), time frame=512 msec;
Site E location=(center): (2940,2630,0), time frame=424 msec.

The measured propagation time was 895 msec/5880 μm. All of the test sites are in the z=0 plane. FIG. 1C, previously discussed, was drawn using the above data for test sites A, B, and C, as plotted in two dimensions. These three sites are chosen as they are the furthest from the defect, as determined by their respective time frames, and their radii are determined by their respective time frame divided by the propagation time. Triangulation of the defect is calculated using the following equations:

$x^2+y^2=r^2$ (for each of sites A, B, C), where x and y are the coordinates of the respective test sites and r is the radius.

A–B=B–C is the intercept calculation for 3 circles A, B, C.

Sites D and E overlap the identified location. Site E is in the center and Site D is closest to the defect. The z plane has been ignored up to this point but D and E have significant z angle with the opposite side of the triangle in z at 750 μm below z=0, Since the purpose is to triangulate in 3-D, this simplified 2-D case does a disservice to the acquired data. Using the intercept method is convenient but results in unwanted measurement error. Additionally, since the defect is not on the same z=0 plane as the test sites, error compounds as the slope of the z vector increases.

In the three-dimensional case, the following equations form a three-dimensional matrix set for all five data points. The propagation period for the z dimension is longer than x-y due to the die attach. In this case, the copper paddle is heated. The propagation takes 2.5 times longer to reach the die through the die attach. The Pythagorean theorem is used to calculate the ratio from the center point to the identified locus in order to approximate the hypotenuse length. Applying the following equations yields a 3-D view of the spherical propagation waves. The center of each sphere is defined by the x, y, and z coordinates of the test site; the radius of each sphere is the measured time frame ($a_{msec}$ through $e_{msec}$) divided by the propagation time constant $s_{msec/um}$=895 msec/5880 µm. Variables t and u in the equations define the continuous set of points to plot in 3-D space to define a portion or the entire sphere surface to be displayed. The surface of the respective spheres is defined by the following equations:

$$\begin{bmatrix} x \\ y \\ z \end{bmatrix} = \begin{bmatrix} x_a \\ y_a \\ z_a \end{bmatrix} + \begin{bmatrix} \sin t \sin u \\ \sin t \cos u \\ \cos t \end{bmatrix} * \left( \frac{a_{msec}}{s_{msec/um}} \right), t = 0 \ldots 2\pi, u = 0 \ldots 1\pi$$

$$\begin{bmatrix} x \\ y \\ z \end{bmatrix} = \begin{bmatrix} x_b \\ y_b \\ z_b \end{bmatrix} + \begin{bmatrix} \sin t \sin u \\ \sin t \cos u \\ \cos t \end{bmatrix} * \left( \frac{b_{msec}}{s_{msec/um}} \right), t = 0 \ldots 2\pi, u = 0 \ldots 1\pi$$

$$\begin{bmatrix} x \\ y \\ z \end{bmatrix} = \begin{bmatrix} x_c \\ y_c \\ z_c \end{bmatrix} + \begin{bmatrix} \sin t \sin u \\ \sin t \cos u \\ \cos t \end{bmatrix} * \left( \frac{c_{msec}}{s_{msec/um}} \right), t = 0 \ldots 2\pi, u = 0 \ldots 1\pi$$

$$\begin{bmatrix} x \\ y \\ z \end{bmatrix} = \begin{bmatrix} x_d \\ y_d \\ z_d \end{bmatrix} + \begin{bmatrix} \sin t \sin u \\ \sin t \cos u \\ \cos t \end{bmatrix} * \left( \frac{d_{msec}}{s_{msec/um}} \right), t = 0 \ldots 2\pi, u = 0 \ldots 1\pi$$

$$\begin{bmatrix} x \\ y \\ z \end{bmatrix} = \begin{bmatrix} x_e \\ y_e \\ z_e \end{bmatrix} + \begin{bmatrix} \sin t \sin u \\ \sin t \cos u \\ \cos t \end{bmatrix} * \left( \frac{e_{msec}}{s_{msec/um}} \right), t = 0 \ldots 2\pi, u = 0 \ldots 1\pi$$

The following constants are used:

| Site | x | y | z | Time frame |
|---|---|---|---|---|
|  | $s_{msec/um}$ = 895 msec/5880 µm | | | |
| A | $x_a$ = 5880 µm | $y_a$ = 0 µm | $z_a$ = 0 µm | $a_{msec}$ = 680 msec |
| B | $x_b$ = 0 µm | $y_b$ = 0 µm | $z_b$ = 0 µm | $b_{msec}$ = 976 msec |
| C | $x_c$ = 0 µm | $y_c$ = 5260 µm | $z_c$ = 0 µm | $c_{msec}$ = 832 msec |
| D | $x_d$ = 5880 µm | $y_d$ = 5260 µm | $z_d$ = 0 µm | $d_{msec}$ = 512 msec |
| E | $x_e$ = 2940 µm | $y_e$ = 2630 µm | $z_e$ = 0 µm | $e_{msec}$ = 424 msec |

Solving for the intersection of these spheres provides the following:

$$\begin{bmatrix} x \\ y \\ z \end{bmatrix} = \begin{bmatrix} 4800 \\ 3870 \\ 1900 \end{bmatrix} * u, u = 0 \ldots 2$$

As noted above, the value of the z factor is skewed due to the thermal conduction differences of the die attach. Correcting for the z value with the calculated 2.5 correction factor, the value of z is approximately 750.

Figure 1D:
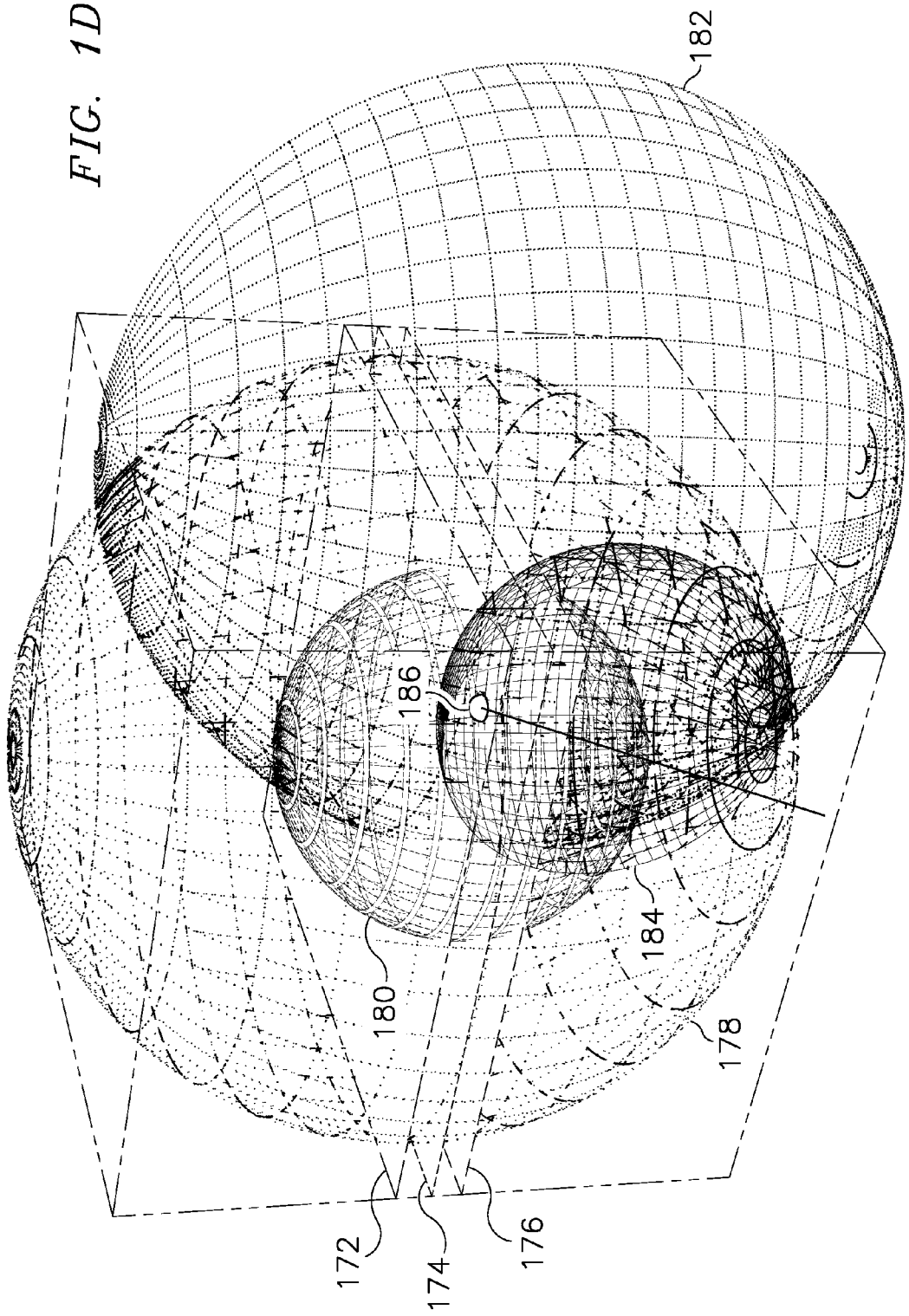
FIG. 1D illustrates trilateration of a defect using time of flight data from a device-under-test.

FIG. 1D illustrates the plotting of this data into three dimensions. Planes 172, 174, 176 define layers of the DUT. Each of spheres 178, 180, 182, 184 has a respective center at one of the test sites and a radius defined by the respective calculated distance from the "error" being detected. To make this three-dimensional figure easier to visualize on a two-dimensional page, only the "frontside" of sphere 182 and the "backside" of sphere 184 are drawn. Point 186 defines the intersection of these four spheres and marks the region of the defect. A photograph of the plotted spheres is available in the article "Gradient Thermal Analysis by Induced Stimulus", authored by the inventor, Jim Colvin, and forming a part of the provisional application from which this application claims priority. The article is available on the Internet by searching on the title. The disclosed TOFSIFT method has been successfully used to localize both leakage failures and functional failures. Failures with hysteresis or instability are more problematic. Failures with hysteresis must be analyzed one-shot or with a reset to clear the hysteresis for each new measurement cycle. Unstable devices need some repeatability to be analyzed and the severity of the instability dictates the resolution. Errors in the z dimension for stacked die can be similar to the problem discussed earlier with regard to die attach. Different thermal conduction of the die attach requires a compensator (multiplier) to be applied depending on the die stack. Currently, this is determined experimentally by comparing the TOF data from several additional locations roughly equidistant from the approximate location of the defect. Delamination and void issues can be overcome with carefully milled access points along the die edges of the stacked array.

Ideally, when the intersection of the spheres is calculated, the intersection would be at exactly one point, with one possible solution to the current location, but in reality, the intersection is a culmination of near proximity surfaces. The defect can be located within any point in the proximal area, compounding the error. Precision is considered "diluted" when the area grows larger; this dilution of precision is a measure of this error factor. The process can be automated to position and fire the laser as well as calculate the locus with averaging to minimize error. The (TOA) Time Of Arrival or (TDOA) Time Difference Of Arrival are two of multiple algorithms available to provide a best-fit solution to trilateration. Although a $CO_2$ laser was used in the testing discussed above, the inventor is exploring the use of both solid state and gas discharge lasers in this work. Further, finite element models can be incorporated to improve 3-D triangulation in complex packages and used in conjunction with CAD views.

Figure 3:
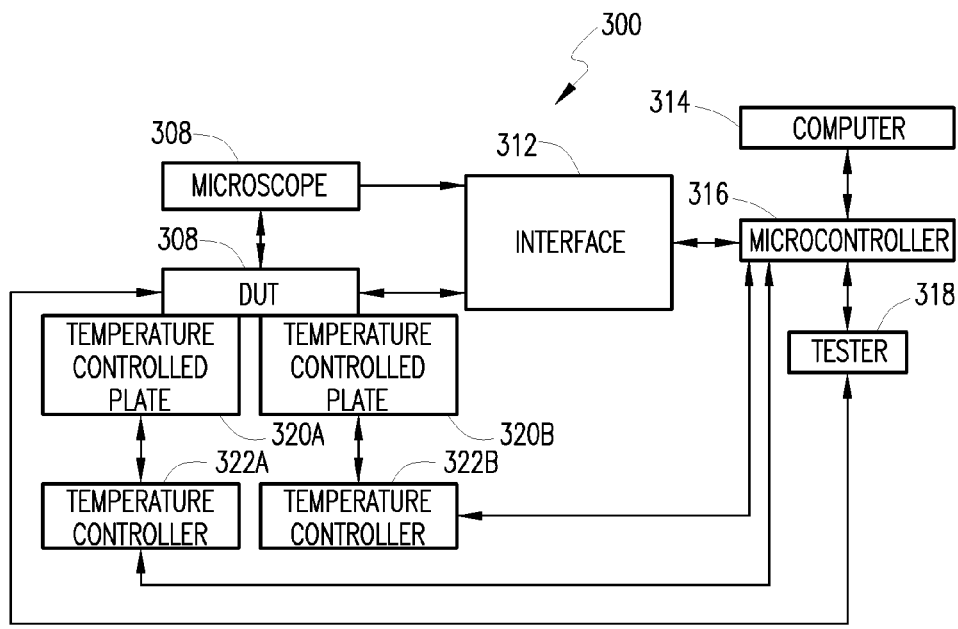
FIG. 3 depicts a block diagram of an apparatus operable for gradient thermal analysis in accordance with an embodiment of the present disclosure.
Figure 4:
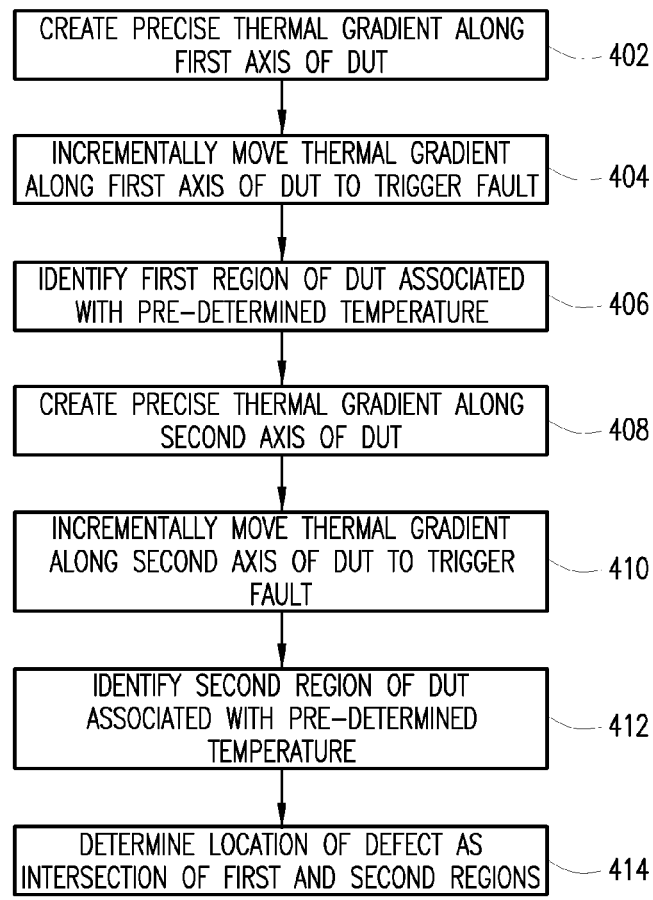
FIG. 4 is a flow chart of an example method for gradient thermal analysis for use with the apparatus shown in FIG. 3 in accordance with an embodiment of the present disclosure.

Turning to FIGS. 3 and 4, a further embodiment of the disclosed gradient thermal analysis is discussed. When opposing ends of a copper paddle attached to a device are held at two different but precise temperatures, a corresponding precise thermal gradient will form across the surface of the device. It is then possible to localize a thermally sensitive region by moving the temperature gradient across the device while monitoring the DUT either parametrically or functionally. This concept is similar to Magnetic Resonance Imaging, except that the field gradient is replaced with a thermal gradient and the defect is the detector. FIG. 3 illustrates an apparatus 300 that can be used to perform an embodiment of gradient thermal analysis of a DUT. Precision temperature controlled plates 320A and 320B are controlled by temperature controllers 322A and 322B and are used to control and walk the gradient across the DUT 308. In at least one embodiment, the temperature controlled plates are Peltier elements. Microscope 304, interface 312, computer 314, microcontroller 316 and tester 318 are similar to those described earlier for FIG. 1A and are not further explained; microscope 304 is not required, but can be used for visualization if desired. Although two temperature-controlled plates are shown in FIG. 3, a chuck could be used to control the cold side of the gradient with a Peltier, liquid or resistive heater forcing the other side.

FIG. 4 is a flowchart of a method of using gradient thermal analysis to locate a defect using the apparatus of FIG. 3. Once the defect is characterized, a precise thermal gradient is created along a first axis, e.g., the x-axis, of the DUT (element 402). While monitoring an output from the DUT, the thermal gradient is incrementally walked along the first axis of DUT until the gradient triggers a fault (element 404). That region of the DUT that is at the triggering temperature when the fault is triggered is identified as a first region (element 406). Once the defect has been localized in the x-axis, DUT 308 or temperature-controlled plates 320A, 320B are repositioned 90 degrees in order to localize the defect in a second axis, i.e., the y-axis. A precise thermal gradient is then created along this second axis of the DUT (element 408). The thermal gradient is then walked along the second axis of the DUT until the fault is triggered (element 410). That region of the DUT that is at the triggering temperature when the fault is triggered is identified as a second region. The location of the defect is then determined by the intersection of the first and second identified regions (element 414). Although not specifically shown in this flowchart, a thermal gradient can also be created along a third axis of the DUT, i.e., the z-axis. Creating a precise gradient in the z-axis is generally more difficult than creating the same thermal gradient in the x- or y-axis, but can be very valuable in locating a defect in a stacked die. It is also possible to create a gradient along an axis that runs diagonally across the DUT to provide further localization of the defect. Each time the thermal gradient testing is performed on an additional axis such as the z-axis, an additional region corresponding to the triggering temperature is defined, with the intersection of all of such regions defining the region where the defect is located.

Since this technique is effectively static, the test time is irrelevant. Loop testing or one-shot testing can be performed for pass/fail with a gradient scan or binary search for the threshold temperature at which the gradient is locally at the fail temperature in conjunction with the defect. DUT 308 can be easily positioned over the differential heating system. The greater the gradient and the tighter the tolerance of the defect to temperature change, the better the triangulation of the defect. The technique assumes the defects are not distributed, although a cluster can still be localized. The technique can be iterative, in that once the x position is approximately obtained with a low level gradient, the differential can be increased to more precisely localize the defect while avoiding the continuity issues that walking extreme differential temperatures across the wafer create. The best triangulation data in conjunction with the minimum temperature change required to detect the defect is achieved by precision control of the gradient, as shown in the following equation:

$$\text{Resolution} = \text{Gradient} * \text{Precision} / \Delta\text{Change}$$

If the minimum temperature change required to see a transition from pass to fail ranges from 40.1-40.2 degrees C., then the defect will be resolved (Precision/ΔChange) within a gradient of 0.1 degrees C. These assumptions are based on precise temperature control and a single defect. A chosen gradient of 1 degree C/mm will yield a best-case resolution of 100 μm in x and y. Correspondingly, the measurement precision of leakage as a function of temperature and the slope of the induced gradient define resolution. If a device is characterized with a defect that changes by 1 ohm/degree C and the precision of the measurement is 0.01 ohms then the thermal gradient inside 0.01 degree C is within the range of error. A gradient of 1000 μm/degree C will then infer the triangulation is within 10 μm in x and y. In order to minimize the impact of changing temperatures with a sweeping thermal gradient, the defect can be characterized with a few precise data points at various temperatures resulting in a best fit line or curve applied to the data. A static gradient is then applied and the measured leakage matched to the point on the curve. Wafers that dissipate heat while being tested can still be analyzed, however, the thermal offset will need to be factored into the gradient measurements or a burst mode test performed in order to minimize unwanted substrate heating. Forcing a gradient across a thick metal plate to which the wafer is attached and using closed loop control on the ends is the best method to minimize these issues but takes significantly more power from the controllers if large gradients are desired. Heat load of the Peltier elements needs to be considered for long-term dissipation into the wafer chuck. A high-power temperature controlled chuck capable of cooling serves well to obviate these issues. In testing using this method, infrared investigation with an InSb camera was used to measure the quality of the gradient generated across the wafer and carbon paint was used to calibrate out issues with black body radiation and pixel registration errors during measurement.

Figure 5:
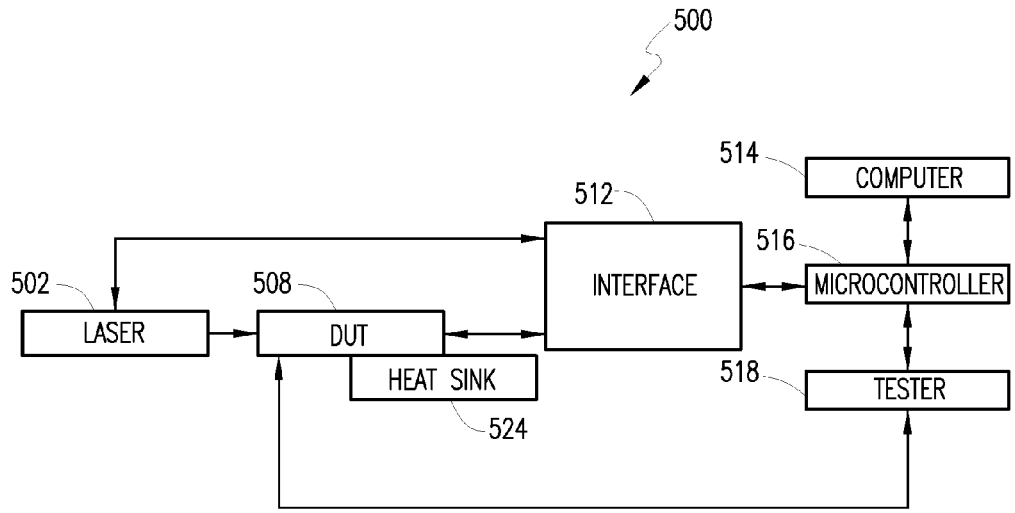
FIG. 5 depicts a block diagram of an apparatus operable for gradient thermal analysis in accordance with an embodiment of the present disclosure.
Figure 6:
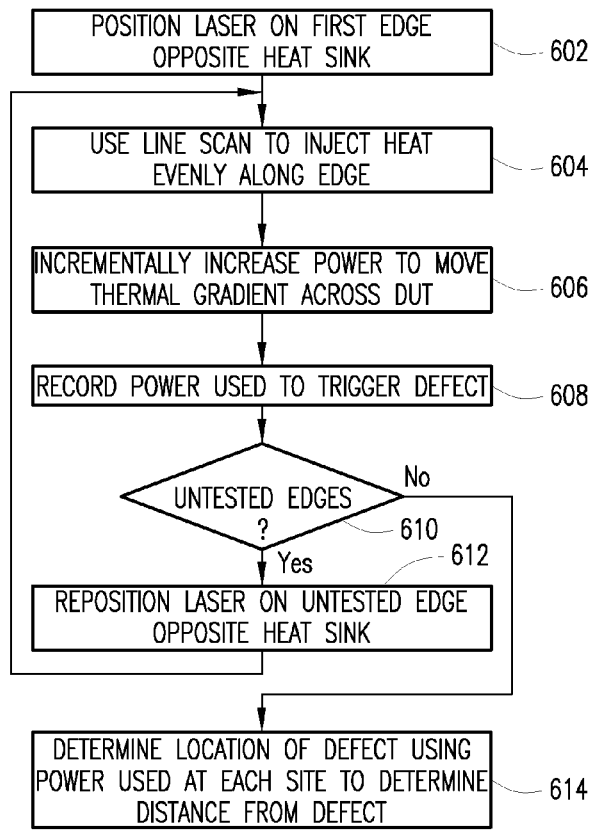
FIG. 6 is a flow chart of a method operable for use with the apparatus shown in FIG. 5 in accordance with an embodiment of the present disclosure.

A variation on the embodiment of FIGS. 3 and 4 is disclosed with reference to FIGS. 5 and 6. Apparatus 500 is similar to apparatus 300 of FIG. 3, however in this embodiment, laser 502 replaces one of the temperature-controlled plates and associated controller and serves as a heat source. A thin slot can be milled along the package edge on angle to allow access with the laser to the die edge. Carbon paint can be used to assist laser absorption as long as the die edge has no delamination issues to allow the carbon paint to wick into sensitive areas. A heat sink 524 can provide the opposite end of the thermal gradient, as shown, or a temperature-controlled plate can be used as in the previous embodiment. Other elements remain largely the same.

Referring now to FIG. 6, a method of gradient thermal analysis is disclosed according to an embodiment of the disclosure using the apparatus of FIG. 5. The laser is positioned on a first edge of the DUT, opposite the heat sink (element 602). A line scan is used to uniformly inject higher levels of average power along an entire edge of the DUT (element 604). The laser power is incrementally increased to walk the gradient across the region of interest on the DUT (element 606). When the defect is triggered, the power required is recorded (element 608). In at least one embodiment, this process is repeated for each of the four edges of the device. Thus, if an untested edge remains (yes to element 610), the laser, DUT and heat sink are repositioned to provide an untested edge to the laser (element 612) and elements 604-608 are repeated for the current edge. Once all of the edges have been tested, the power required to trigger the defect from each edge is used to determine the relative distance from that edge to the defect, thus determining the location of the defect (element 614). In a variation of this embodiment, which is not specifically shown, the laser is injected at various points on the edges of the device; the power used to trigger the defect is recorded and used to trilaterate the defect as explained in the embodiment of FIGS. 1 and 2. This embodiment allows the measured power of the laser required to reach the triggering point of the failure to be related to the distance to the defect. Select input pins should be used for temperature calibration and validation of the linearity of the gradient across the die. Nonlinear effects can be mathematically line fitted by utilizing the multiple pad diodes available on the device before actual testing begins. Optimization of the above techniques can be accomplished by restricting the gap to which the gradient is applied. The gradient can, therefore, be large while avoiding excessive temperatures at the edges.

Based on the foregoing Detailed Description, it should be appreciated that the present disclosure advantageously provides multiple embodiments of a versatile apparatus and method that can be utilized in fault isolation in performing thermal gradient fault testing. Although the disclosure has been described with reference to certain example embodiments, it is to be understood that the embodiments shown and described are to be treated as exemplary embodiments only. Accordingly, various changes, substitutions and modifications can be realized without departing from the spirit and scope of the embodiments as defined by the appended claims.

What is claimed is:

1. A method, comprising:
    selecting a plurality of test sites on a device-under-test (DUT), each of the plurality of test sites having respective coordinates;
    for each of the plurality of test sites, heating the test site at a controlled rate to create a thermal wave that propagates across the DUT and capturing an elapsed time until the heating triggers a known condition at an anomaly that is located a respective distance from the test site; and
    using the respective elapsed time to determine the respective distance between each of the plurality of test sites and the anomaly, wherein the respective coordinates of each of the plurality of test sites and the respective distances from the anomaly are used to determine the location of the anomaly by trilateration.

2. The method of claim 1, wherein determining the respective distance between each of the plurality of test sites and the anomaly comprises dividing the respective elapsed time by the speed of propagation through the DUT.

3. The method of claim 1, wherein determining the respective distances between each of the plurality of test sites and the anomaly comprises scaling the respective elapsed times to determine a best fit.

4. The method of claim 1, wherein determining the location of the anomaly comprises defining, for each of the plurality of test sites, a respective sphere that has a center at the test site and a radius determined by the respective distance between the test site and the anomaly, whereby a surface of the sphere defines all points in space that are the respective distance from the test site, wherein the anomaly is located at the point of intersection of the respective spheres.

5. The method of claim 1, wherein determining the location of the anomaly comprises defining, for each of the plurality of test sites, a respective sphere that has a center at the test site and a radius determined by the respective distance between the test site and the anomaly, whereby a surface of the sphere defines all points in space that are the respective distance from the test site, wherein the anomaly is located in a region near the intersection of the respective spheres.

6. The method of claim 1, further comprising monitoring one of a functional output and a parametric output of the DUT to determine when the known condition is triggered.

7. The method of claim 1, wherein the heating is provided by a laser that is pulsed within threshold limits to provide a relatively constant rate of heating.

8. The method of claim 1, wherein the DUT comprises one of an integrated circuit die, stacked IC dies, an electronic device, an electronic device package and an electronic board.

9. The method of claim 1, further comprising masking photocurrents from the DUT prior to heating the test site.

10. The method of claim 9, wherein the masking is performed by applying flat black paint to a surface of the DUT.

11. An apparatus, comprising:
    a laser for controllably heating a test site on a device-under-test (DUT);
    a sensor for capturing a response signal from the DUT;
    a linear positioning device operable to position the DUT at known coordinates for each of a plurality of test sites;
    a controller operably coupled to the laser, the sensor and the linear positioning device to provide overall control thereof, wherein the controller is programmed, for each test site of the plurality of test sites, to pulse the laser between threshold limits to provide a relatively constant rate of heating to create a thermal wave that propagates across the DUT and to determine a respective elapsed time until the heating of the test site triggers a known condition at an anomaly that is located a respective distance from the test site; and
    a computer operable to be connected to the controller and configured to use the respective elapsed times to determine the respective distance between each of the plurality of test sites and the anomaly, wherein the respective coordinates of each of the plurality of test sites and the respective distances from the anomaly are used to determine the location of the anomaly by trilateration.

12. The apparatus of claim 11, wherein determining the respective distances between each of the plurality of test sites and the anomaly comprises dividing the respective elapsed times by the speed of propagation through the DUT.

13. The apparatus of claim 11, wherein determining the respective distances between each of the plurality of test sites and the anomaly comprises scaling the respective elapsed times to determine a best fit.

14. The apparatus of claim 11, wherein the sensor captures one of a functional signal and a parametric signal from the DUT.

15. The apparatus of claim 11, wherein the computer determines the location of the anomaly by defining, for each of the plurality of test sites, a respective sphere that has a center at the test site and a radius determined by the respective distance between the test site and the anomaly whereby a surface of the sphere defines all points in space that are the respective distance from the test site, wherein the anomaly is located at the point of intersection of the respective spheres.

16. The apparatus of claim 11, wherein the computer determines the location of the anomaly by defining, for each of the plurality of test sites, a respective sphere that has a center at the test site and a radius determined by the respective distance between the test site and the anomaly whereby a surface of the sphere defines all points in space that are the respective distance from the test site, wherein the anomaly is located in a region near the intersection of the respective spheres.

17. A method, comprising:
    selecting a plurality of test sites on a device-under-test (DUT), each of the plurality of test sites having respective coordinates;
    for each of the plurality of test sites, exciting the test site at a controlled rate to create a wave of excitation that propagates across the DUT and capturing a respective elapsed time until the excitation triggers a known condition at an anomaly that is located a respective distance from the test site; and
    using the respective elapsed time to determine the respective distance between each test site and the anomaly, wherein the respective coordinates of each of the test sites and the respective distances from the anomaly are used to determine the location of the anomaly.

18. The method of claim 17, wherein exciting the test site comprises pulsing a laser between threshold limits to heat the test site at a relatively controllable rate.

19. The method of claim 17, wherein determining the location of the anomaly comprises defining, for each of the plurality of test sites, a respective sphere that has a center at the test site and a radius determined by the respective distance between the test site and the anomaly, whereby a surface of the sphere defines all points in space that are the respective distance from the test site, wherein the anomaly is located at the point of intersection of the respective spheres.

20. The method of claim 17, The method of claim 17, wherein determining the location of the anomaly comprises defining, for each of the plurality of test sites, a respective sphere that has a center at the test site and a radius determined by the respective distance between the test site and the anomaly, whereby a surface of the sphere defines all points in space that are the respective distance from the test site, wherein the anomaly is located in a region near the intersection of the respective spheres.

21. The method of claim 17, wherein the DUT comprises one of an integrated circuit (IC) die, stacked IC dies, an electronic device, an electronic device package and an electronic board.

* * * * *